United States Patent
Graebner et al.

(10) Patent No.: US 6,197,375 B1
(45) Date of Patent: Mar. 6, 2001

(54) METHOD COMPRISING REMOVAL OF MATERIAL FROM A DIAMOND FILM

(75) Inventors: John Edwin Graebner, New York, NY (US); Sungho Jin, Millington; Thomas Henry Tiefel, North Plainfield, both of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 08/278,688

(22) Filed: Jul. 21, 1994

Related U.S. Application Data

(63) Continuation of application No. 07/822,470, filed on Jan. 17, 1992, now abandoned.

(51) Int. Cl.$^7$ .................................................. C23C 16/26
(52) U.S. Cl. .................. 427/249.8; 427/250; 427/255.7; 427/369; 427/370; 427/404
(58) Field of Search ............... 51/295; 427/214, 427/217, 249, 250, 255.7, 249.8, 369, 370, 404

(56) References Cited

U.S. PATENT DOCUMENTS

| | | | |
|---|---|---|---|
| 4,063,907 | * 12/1977 | Lee et al. ................................ | 51/295 |
| 4,239,502 | * 12/1980 | Slack et al. ............................. | 51/295 |
| 5,049,165 | * 9/1991 | Tselesin ................................. | 51/295 |
| 5,096,465 | * 3/1992 | Chen et al. ............................. | 51/295 |

FOREIGN PATENT DOCUMENTS

2061904A * 5/1981 (GB) .

OTHER PUBLICATIONS

"Metastable Growth of Diamond and Diamond–Like Phases", by J. C. Angus et al., *Annual Review of Materials Science*, vol. 21, pp. 221–248 (1991).

"Properties and Applications of Diamond", by J. and E. Wilks, Butterworth Heinemann Ltd, 1991, pp. 24, 259–264, 456–458.

"Development and Performance of a Diamond Film Polishing Apparatus With Hot Metals", by M. Yoshikawa, The International Society for Optical Engineering, (SPIE) vol. 1325, "Diamond Optics III", A. Feldman et al, editors, 1990, pp. 210–221.

"Growth, Polishing, and Optical Scatter of Diamond Thin Films", by T. P. Thorpe, The International Society for Optical Engineering, (SPIE) vol. 1325, "Diamond Optics III", A. Feldman et al., editors, 1990, pp. 230–237.

"The Polishing of Polycrystalline Diamond Films", by A. B. Harker et al., The International Society for Optical Engineering (SPIE) vol. 1325, "Diamond Optics III", A. Feldman et al., editors, 1990, pp. 222–229.

* cited by examiner

*Primary Examiner*—Shrive Beck
*Assistant Examiner*—Bret B. Chen
(74) *Attorney, Agent, or Firm*—Eugen E. Pacher

(57) ABSTRACT

Many potential applications of CVD diamond film require the ability to remove a predetermined quantity of material from a surface of the film. We have discovered that such removal is advantageously accomplished by contacting the surface of the polycrystalline diamond film with a metal selected from Fe, Ni, Mn and Ti (preferably Fe and Mn, most preferably Mn), and maintaining the metal-contacted diamond film at a temperature in the range 600–1100° C. (preferably 800–1000° C.) without relative lateral motion between the film and the metal, for an effective time for removal of the quantity of material, exemplarily less than 100 hours. The metal can be in any appropriate form, e.g., a deposited layer, (including a patterned layer), a foil, or powder. We have also discovered that the local thermal conductivity of CVD diamond films typically increases with distance from the lower surface of an as-grown film. Thus, in applications such as heat spreading it will frequently be advantageous to remove some of the fine-grained, low thermal conductivity material adjacent to the lower surface of the as-grown CVD film. Such removal can be accomplished by means of the above-described technique.

10 Claims, 5 Drawing Sheets

100 μm

100 μm

5μm

5μm

METHOD COMPRISING REMOVAL OF MATERIAL FROM A DIAMOND FILM

This application is a continuation of application Ser. No. 07/822,470, filed on Jan. 17, 1992 now abandoned.

FIELD OF THE INVENTION

This invention pertains to methods of manufacture. In particular, it pertains to such methods that involve removal of material from a diamond film.

BACKGROUND OF THE INVENTION

It is known that diamond films can be readily produced by chemical vapor deposition (CVD). See, for instance, J. C. Angus et al., *Annual Review of Materials Science*, Vol. 21, p. 221 (1991), incorporated herein by reference.

Diamond is not only the hardest known substance but also has the i highest elastic modulus, highest atomic density, highest Debye temperature, and highest room temperature thermal conductance. It is chemically inert and highly transparent from the ultraviolet to the infrared. Furthermore, diamond is a wide gap semiconductor that may be useful for high temperature and/or high voltage device applications. Because of these and other properties, diamond films are of interest for applications such as heat spreaders, optical windows, X-ray lithography, low-friction or wear-resistant surfaces, cuting tool coatings, and active electronic device elements.

For many applications it will be necessary to remove material from a diamond film. For instance, currently available CVD diamond films typically exhibit a roughly cone-shaped columnar structure, with relatively fine-grained material near the bottom of the film, and relatively large-grained faceted material near the top. (See, for instance, FIGS. 1.16(a) and (b) of "Properties and Applications of Diamond", J. and E. Wilks, Butterworth Heinemann Ltd, 1991, p. 24.) Exemplarily, films of thickness of order 200 $\mu$m frequently exhibit variations in height of the top surface of order 20–60 $\mu$m. A strongly faceted surface with significant height variations is clearly undesirable for, e.g., an optical window or a heat spreader. Thus, techniques for removing material from a diamond film are required.

Because of the extreme hardness of diamond, mechanical polishing or thinning of a CVD diamond film is time consuming and costly. Polishing by reaction with oxygen ions or gas tends to cause undesirable grain boundary etching and pitting. Other removal techniques such as laser ablation, Ar ion beam irradiation, and electrical discharge have been reported but have not proven fully satisfactory. See, for instance, "Properties and Applications of Diamond", op. cit., especially pp. 259–263.

It is known that diamond grinding wheels perform relatively poorly when used to grind hard steel. This has been attributed to graphitization of diamond particles of the grit. It has been suggested that the thus produced graphite is removed from the grit by abrasion rather than by diffusion into the steel. Ibid, pp. 456–458. See also p. 264 of the same monograph, where the authors suggest (because diamond wears at " . . . quite an appreciable rate when rubbed on ferrous metals . . . ") that it should be possible to polish a diamond by rubbing at high speed with a steel or cast-iron wheel, but proceed to point out that in actual fact this process typically is very slow compared to normal rates of polishing. See, however, M. Yoshikawa, The International Society for Optical Engineering, (SPIE) Vol. 1325, "Diamond Optics III", A. Feldman et al., editors, 1990, p. 210, wherein polishing of polycrystalline diamond film by means of iron and nickel polishing wheels is reported, at temperatures in the range 750–950° C., in vacuum, $H_2$, He, Ar and $N_2$. See also T. P. Thorpe et al., ibid p. 230, who disclose polishing of polycrystalline diamond film by means of an iron polishing wheel at 650–850° C. in flowing $H_2$, and A. B. Harker et al., ibid p. 222, who have lapped polycrystalline diamond films on an iron plate at 730–900° C. in $H_2$.

The above described polishing and lapping techniques cannot be used to pattern a diamond film, and may at times be impractical if removal of a substantial amount of material is desired.

On page 264 of the monograph by J. and E. Wilks can be found a review of earlier work (A. P. Grigoriev et al., *Indiagua*, Vol. 39(3), pp. 47–54, 1984), which reads as follows:

"A different way of working diamond with metal has been described by Grigoriev and Kovalsky (1984). The principle of their method is shown in FIG. 9.34. A piece of iron or nickel foil is cut to shape and placed on the surface of the diamond which is then heated to about 1000° C. in an atmosphere of hydrogen. At this temperature the carbon atoms in contact with the lower surface of the foil diffuse through the foil to the top surface where they react with the hydrogen and are carried away as methane. Hence the foil sinks into the diamond as shown, engraving its shape on the surface. The authors describe variants of this method which they have developed for various purposes including sawing and drilling."

From the above quote and FIG. 9.34 of the monograph it is clear that the prior art method was used on a single crystal of diamond and not on polycrystalline film.

From the above discussion it will be apparent that the art does not yet possess a fully satisfactory technique for removing material from a diamond film. Thus, it would be highly desirable to have available a simple, inexpensive and efficient technique for removing material from a (polycrystalline) diamond film, that is free of some of the limitations of prior art techniques. This application discloses such a technique.

THE INVENTION

In a broad aspect the invention is a method of making an article that comprises a polycrystalline diamond film, wherein the method comprises a novel technique for removing a predetermined amount of material from the film.

By diamond "film" we mean herein a diamond body, either attached to another body or free-standing, that has two dimensions ("length" and "width") which are substantially larger than the third dimension ("thickness").

More specifically, the polycrystalline diamond film has at least one free major surface (e.g., the "top" surface), and the method comprises removing diamond material from the free major surface.

The removal step comprises contacting at least a portion of the free major surface of the film with metal selected from the group consisting of Fe, Ni, Mn and Ti such that the metal is in intimate contact with said at least portion of the free surface, and maintaining the metal-contacted diamond film at an effective temperature (typically in the range 600–1100° C., preferably in the range 800–1000° C.) and for a time sufficient to result in removal of the predetermined amount of diamond from the film. The heat treatment time typically is in the range 0.1–1000 hours, preferably less than about 100 hours. Significantly, removal of diamond takes place without relative lateral motion between the diamond film and the contacting metal. By "lateral" motion is meant motion in a direction parallel to the free major surface. The heat treatment can be carried out in any appropriate atmosphere (e.g., an inert atmosphere such as Ar, He, Ne, or $N_2$, or a reactive one such as $H_2$), including a reduced pressure atmosphere (commonly termed a "vacuum"). The intimate contact results from i) urging together the metal and the polycrystalline diamond film, or ii) depositing a layer of the metal on the at least portion of the free major surface of the polycrystalline diamond film.

In an exemplary embodiment of the invention the novel technique is used to substantially remove faceting of the top surface of a CVD diamond film. In another exemplary embodiment the technique is used to remove the, typically fine-grained, "bottom" portion of a CVD diamond film.

Figure 1:
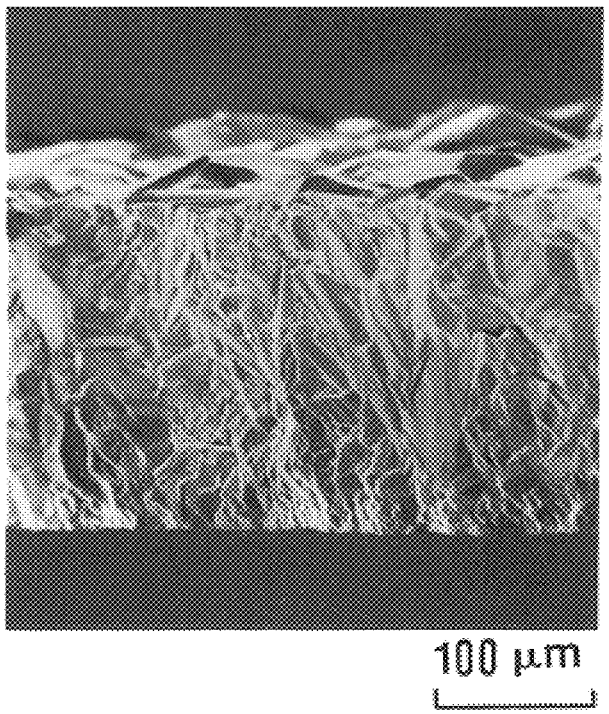
FIGS. 1 and 2 are cross-sectional SEM micrographs of a CVD diamond film respectively before and after heat treatment according to the invention.
Figure 2:
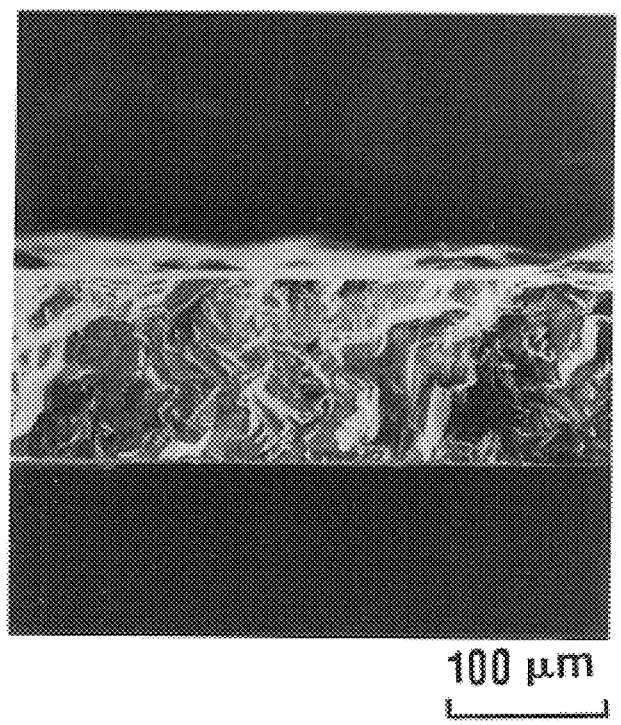

In a particular and exemplary embodiment of the invention we thinned (commercially available) free-standing CVD diamond film (~220 μm thick) as follows: an about 1 $mm^2$ piece of the film was sandwiched between two (~250 μm thick) iron foils, and heated under about 3000 psi (about 20.7 MPa; applied by a weight on top of the sandwich) pressure at 900° C. for 48 hours in an Ar atmosphere. After the heat treatment the iron foils could be easily removed from the diamond film. FIGS. 1 and 2 show cross sectional SEM (scanning electron microscope) micrographs of the film before and after the heat treatment, respectively. As can be seen, top surface faceting is greatly diminished, and a substantial amount of the fine-grained material in the bottom portion of the film is removed. The overall thickness of the film was reduced to about 120 μm.

Figure 3:
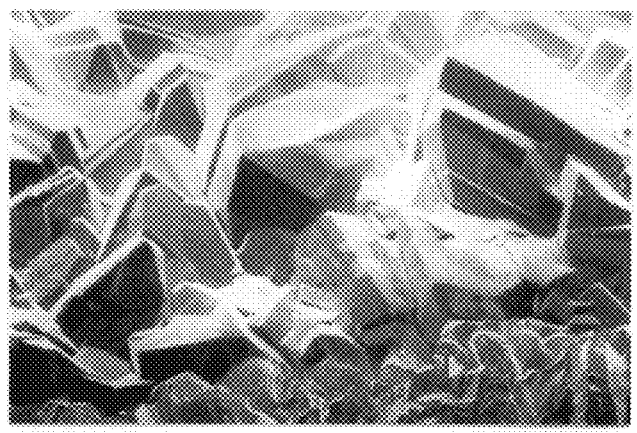
FIGS. 3, 4 and 5 are SEM micrographs of a surface of a CVD diamond film respectively before heat treatment, after heat treatment, and after polishing.
Figure 4:
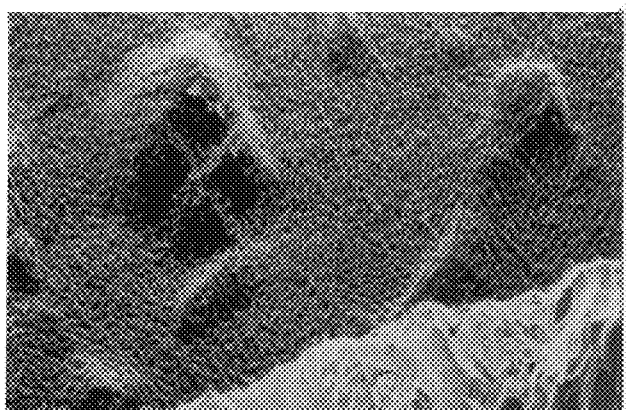
Figure 5:
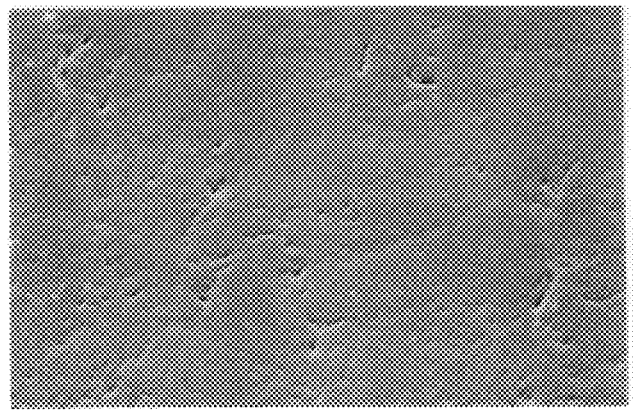

A diamond film treated as described above frequently has a thin (~0.5 μm) layer of black, porous material left on the surface after removal of the iron foils. The black material is easily removed (e.g., by a process that comprises a 10 minute polish on a diamond-bonded wheel), and typically contain C and Fe (exemplarily in proportion 4:1). FIGS. 3–5 show the top surface morphology of a CVD diamond film before heat treatment, after heat treatment, and after polishing, respectively. Analysis of the iron foils subsequent to the heat treatment revealed the presence of a substantial amount of carbon in the iron foils. On the other hand, energy-dispersive X-ray analysis of the heat treated and lightly polished diamond films did not show the presence of any iron in the film, and Raman spectra from the film were essentially identical to those from the (relatively large-grained) upper portion of the fracture surface, in the original diamond film, indicating that the quality and nature of the diamond bond have not been compromised by the thinning heat treatment.

Figure 6:
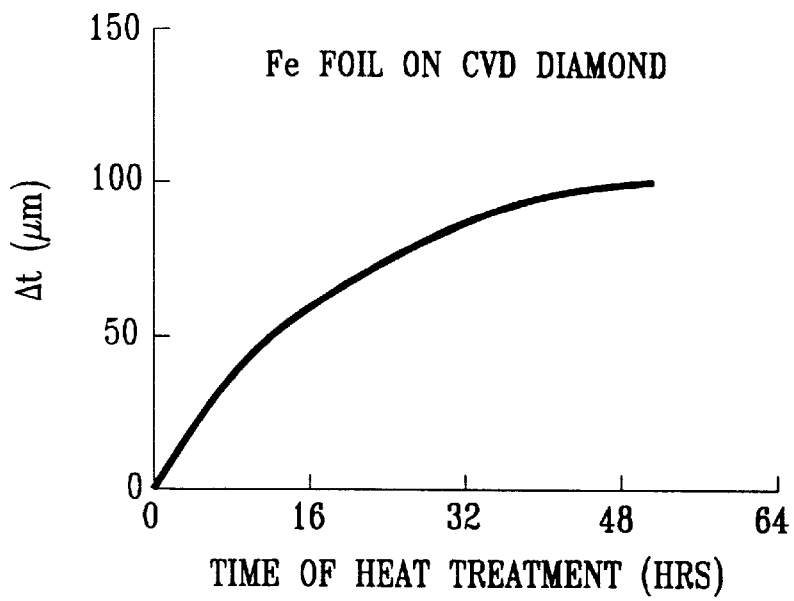
FIG. 6 shows an exemplary relationship between thickness removed from a diamond film and heat treatment time.

FIG. 6 shows exemplary data on thickness change (Δt) vs. time of heat treatment [900° C., Fe foil, contact pressure of 3000 psi (20.7 MPa), Ar atmosphere].

The invention can be practiced in many different ways. For instance, the diamond film can be contacted with metal by depositing (e.g., by sputtering, evaporating or electroless deposition) a layer of metal on the surface of the film. The metal layer can uniformly cover the whole surface, or it can be patterned to cover only a portion or portions of the surface. The metal layer can be formed in single-step or multi-step fashion. For instance, in order to achieve increased solubility of carbon in the metal layer, it may be desirable at times to follow the initial deposition of a metal layer by, e.g., sputtering with additional deposition, e.g., by means of electroplating.

Because typically a deposited metal layer is in intimate contact with the surface of the diamond film, application of a force that urges the metal against the diamond during the heat treatment frequently can be omitted. This is expected to be of substantial advantage in industrial application of the inventive method. After the heat treatment the deposited metal can be readily removed by a conventional removal step, e.g., involving chemical etching. A brief optional mechanical polish subsequent to metal removal may increase flatness of the diamond surface and thus may at times be advantageous.

In another variant of the invention the diamond film is contacted not with a continuous metal body (e.g., foil or deposited layer) but instead with metal powder. Use of powder instead of foil may be advantageous for hard and brittle metals such as Mn.

Material removal can be from the top surface, the bottom surface, simultaneously from the top and bottom surfaces, or from any other surface of the film. Diamond films can be heat treated singly, in a stack comprising a multiplicity of films separated by metal, or in any other desired manner. The ability to simultaneously process a multiplicity of diamond films is a significant aspect of the invention, making possible significant cost savings over prior art techniques which typically do not offer the possibility of batch processing.

Figure 8:
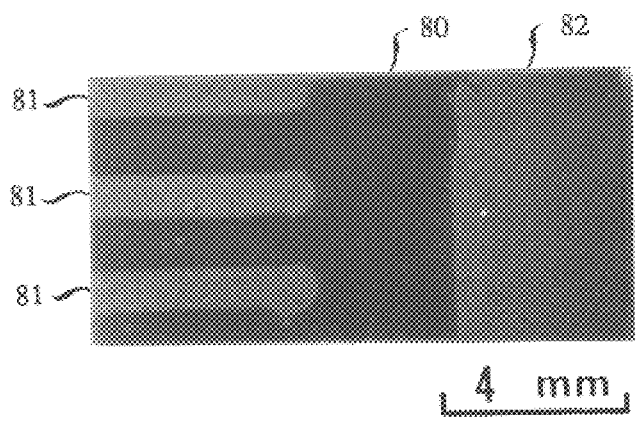
FIG. 8 is an optical micrograph of the patterned surface of a CVD diamond film.

FIG. 8 shows an optical micrograph of a patterned bottom surface of a CVD diamond film, wherein numeral 80 refers to the as-received region, 81 to regions that had been covered by iron film, and 82 to a region that had been covered by a 1.5 μm thick Mn film, deposited by electron beam evaporation. Heat treatment was at 900° C., 24 hours in Ar. This was followed by a chemical etch in 50% HCl.

Figure 9:
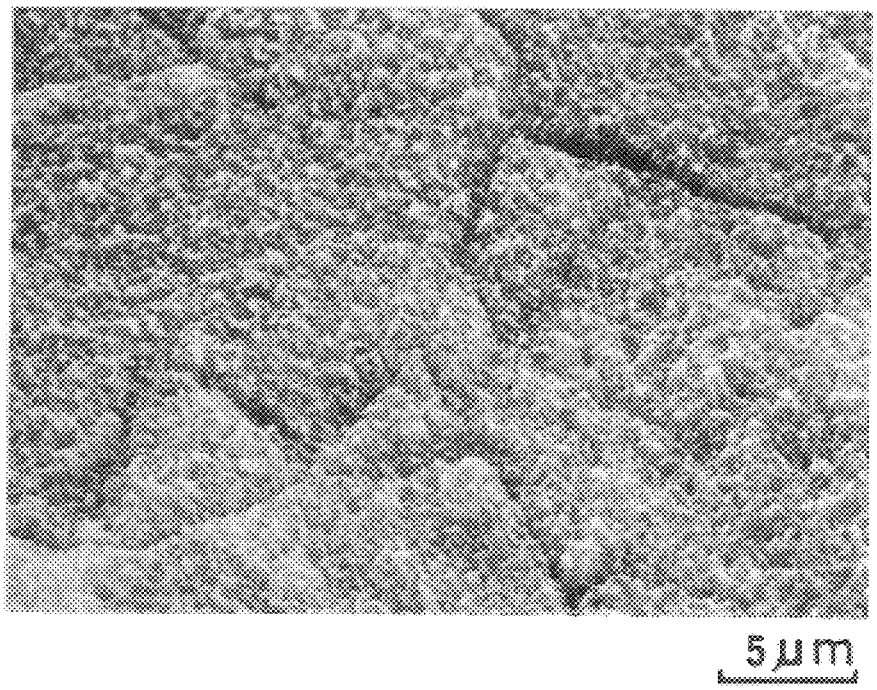
FIGS. 9 and 10 are SEM micrographs of the top surface of a CVD diamond film before and after heat treatment with Mn powder, respectively.
Figure 10:
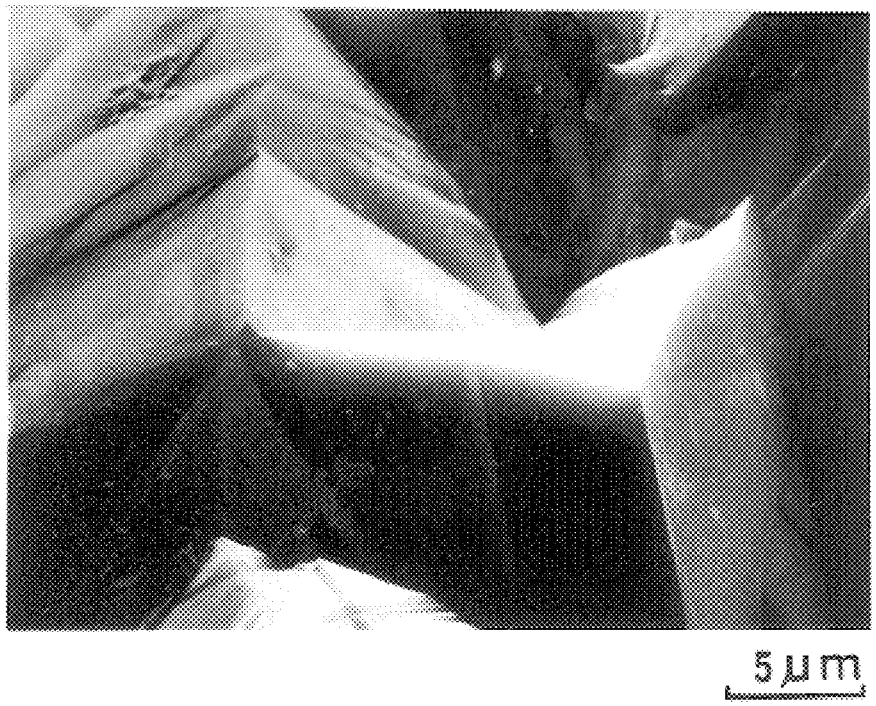

We have found that in many cases Mn produces even better results than Fe (frequently resulting in more rapid removal and/or a smoother surface), and some preferred embodiments of the invention comprise contacting the diamond film with Mn. FIGS. 9 and 10 respectively show high magnification (×4000) SEM micrographs of a portion of the as-received top surface of CVD diamond film, and a portion of the surface after heat treatment, with Mn powder in contact with the surface. The invention can also be practiced with Ni or Ti, but Mn and Fe are currently preferred.

After heat treatment and, typically, removal of the contacting metal there frequently remains on the diamond surface unwanted reaction product. The reaction product generally can be removed relatively easily, e.g., by means of an appropriate chemical etch. For instance, the reaction product after contact with Mn powder typically can be removed by means of a short (several minutes) etch in 50% HCl solution at room temperature. The reaction product after contact with Fe is generally somewhat more difficult to remove, exemplarily requiring a mechanical polish after 12 hours in 1:1 $H_2SO_4$ and $HNO_3$ at 80° C.

Figure 7:
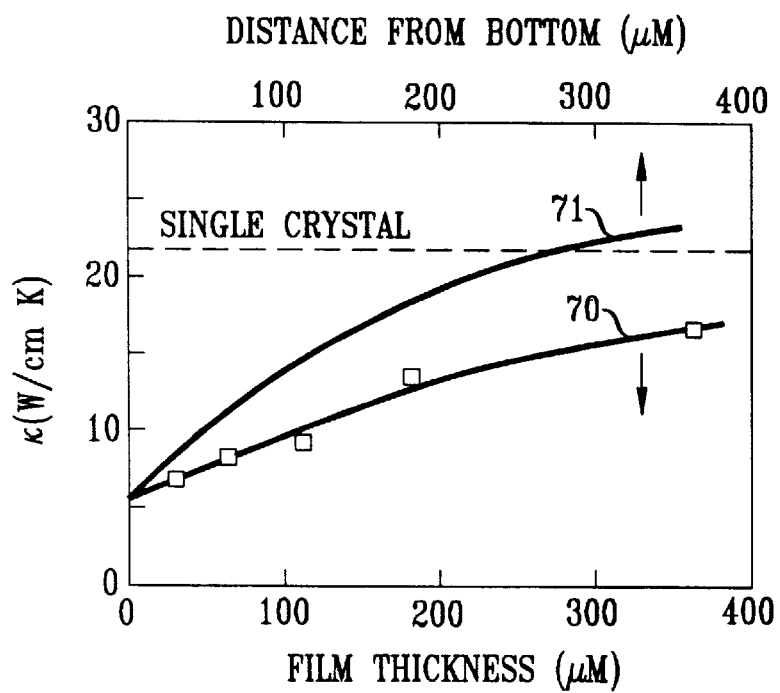
FIG. 7 shows local and average thermal conductivity of a diamond film as a function of distance from the bottom surface and of film thickness, respectively.

We have also made the unexpected discovery that the local thermal conductivity (ic) of CVD polycrystalline diamond film typically varies significantly as a function of distance from the bottom surface of the film. This is illustrated by FIG. 7, wherein numeral 70 refers to the measured average thermal conductivity of diamond films of various thicknesses, and 71 refers to the local thermal conductivity as a function of distance from the bottom surface of the films. The local x was derived from the measured average κ by a mathematical differentiation procedure.

The relatively low thermal conductivity of the fine-grained region of diamond films may not only be due to the abundance of grain boundaries between diamond crystallites but may at least in some cases be due also to the presence of substantial amounts of impurities trapped at grain boundaries. The presence of these impurities typically will also affect optical, electrical and/or mechanical properties of the films. For instance, if CVD diamond is to be used as a heat spreader, with the bottom (naturally relatively smooth) surface of the film in contact with the heat source, then the fine-grained region may actually act as a thermal impedance, as compared to the other portions of the diamond film, resulting in impaired performance of the combination.

Thus, it will be advantageous in at least some applications (e.g., for use of diamond film as heat spreader or optical window) to remove the bottom portion of a relatively thick polycrystalline diamond film, since this will result in a film of thickness t having, e.g., substantially higher heat conductance than an otherwise identical as-grown diamond film of thickness t.

A preferred technique for removing the fine-grained bottom portion of a relatively thick (e.g., >100 μm) CVD polycrystalline diamond film is by means of the above disclosed inventive removal technique. Use of the inventive technique in a process of manufacturing apparatus that comprises a heat source (e.g., laser, LED, or other electronic or opto-electronic device) whose heat output has to be spread for effective dissipation by means of a diamond film is contemplated.

More specifically, a method of making an article that comprises heat generating means (e.g., a laser diode) and a polycrystalline diamond film of thickness t in thermal contact with the heat generating means comprises providing a polycrystalline diamond film of thickness greater than t that comprises relatively fine-grained diamond material adjacent to a first major surface of the diamond film, and relatively coarse-grained diamond material adjacent to a second major surface of the diamond film. The method further comprises removing a quantity of diamond material from the diamond film such that the diamond film of thickness t results. Significantly, at least a first part of the removed diamond material is relatively fine-grained diamond material adjacent to the first major surface. The method also comprises thermally conductively mounting the heat generating means on the thus produced polycrystalline diamond film of thickness t.

Figure 11:
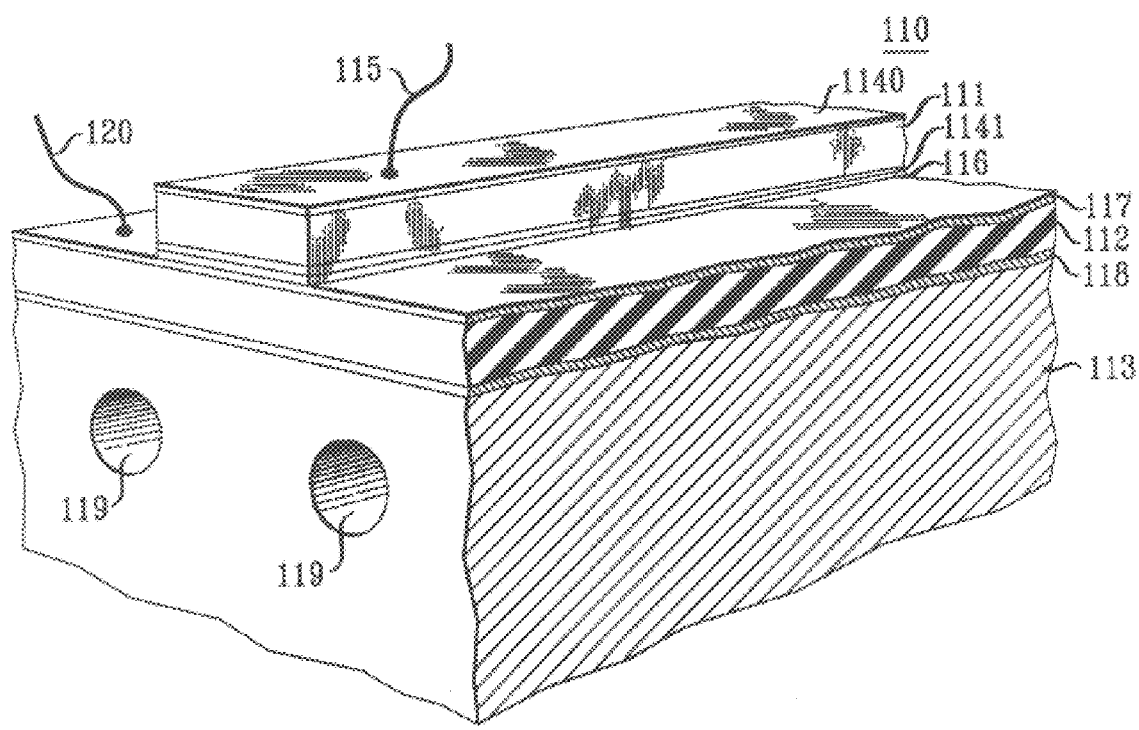
FIG. 11 schematically depicts an exemplary article according to the invention.

FIG. 11 schematically depicts an exemplary article 110 according to the invention wherein numeral 111 refers to a semiconductor laser, 112 to a CVD diamond film heat spreader, and 113 to a heat sink, exemplarily a Cu body with passages 119 for flowing a cooling fluid therethrough. The laser comprises metalization layers 1140 and 1141, and is conductively attached (e.g., by means of solder layer 116) to top metalization layer 117 of the diamond film, which in turn is heat conductively (e.g., by means of bottom metalization layer 118 and a solder layer that is not shown) attached to the heat sink. Numerals 115 and 120 refer to conventional wire leads.

What is claimed is:

1. Method of making an article that comprises a film of diamond, the method comprising a) providing a film of polycrystalline diamond having at least one free major surface; and b) removing a quantity of diamond material from said free major surface;

wherein step b) comprises c) contacting at least a portion of the free major surface with metal selected from the group consisting of Fe, Ni, Mn, and Ti by i) depositing a layer of the metal on at least a portion of the free major surface; or ii) urging a body of the metal against the free major surface; or iii) contacting the free major surface with a powder of the metal; and d) maintaining the metal-contacted diamond film at a temperature in the range 600–1100° C. without relative motion in any direction parallel to the free major surface between the diamond film and the contacting metal, for an effective time for removal of said quantity of diamond material.

2. Method of claim 1, wherein step c) comprises depositing said metal layer on at least a portion of the free major surface.

3. Method of claim 2, comprising patterning the deposited metal layer.

4. Method of claim 1, wherein step c) comprises urging a metal foil against the free major surface.

5. Method of claim 1, wherein step c) comprises contacting the free major surface with said metal powder.

6. Method of claim 1, wherein the metal is Mn, the temperature is in the range 800–1000° C., and the time is less than 100 hours.

7. Method of claim 1, comprising providing a multiplicity of diamond films, and simultaneously removing a quantity of material from each of said multiplicity of diamond films.

8. Method of making an article comprising heat generating means and a polycrystalline diamond film of thickness t in thermal contact with said means, the method comprising providing the diamond film and the heat generating means, and thermally conductively mounting said means on the diamond film;

CHARACTERIZED IN THAT the method further comprises a) providing a polycrystalline diamond film of thickness greater than t that comprises relatively fine-grained diamond material adjacent to a first major surface of the diamond film, and relatively coarse-grained diamond material adjacent to a second major surface of the diamond film, and, prior to mounting of the heat generating means on the diamond film, b) removing a quantity of diamond material from the diamond film such that the diamond film of thickness t results, at least a first part of the removed material being relatively fine-grained diamond material adjacent to the first major surface.

9. Method of claim 8, wherein step b) comprises contacting at least a portion of the first major surface with metal selected from the group consisting of Fe, Ni, Mn, and Ti, and maintaining the metal contacted diamond film at a temperature in the range 600–1100° C. without relative motion between the diamond film and the contacting metal, for a time effective for removal of said at least first part of the material.

10. Method of claim 8, wherein the heat generating means are a semiconductor laser or a semiconductor light emitting diode (LED), and wherein the article comprises means for flowing electrical current through said laser or LED.

* * * * *